(12) United States Patent
Yeh et al.

(10) Patent No.: US 9,691,611 B2
(45) Date of Patent: Jun. 27, 2017

(54) METHOD OF FABRICATING TWO-DIMENSIONAL LAYERED CHALCOGENIDE FILM

(71) Applicant: G-FORCE NANOTECH LTD., Kaohsiung (TW)

(72) Inventors: Chao-Hui Yeh, Hsinchu (TW); Jen-Kuan Chiu, Hsinchu (TW)

(73) Assignee: G-FORCE NANOTECH LTD., Kaohsiung (TW)

( * ) Notice: Subject to any disclaimer, the term of this patent is extended or adjusted under 35 U.S.C. 154(b) by 0 days.

(21) Appl. No.: 14/989,848

(22) Filed: Jan. 7, 2016

(65) Prior Publication Data

US 2016/0240376 A1    Aug. 18, 2016

Related U.S. Application Data

(60) Provisional application No. 62/116,668, filed on Feb. 16, 2015.

(51) Int. Cl.
| | |
|---|---|
| *H01L 21/20* | (2006.01) |
| *H01L 21/02* | (2006.01) |
| *C23C 16/48* | (2006.01) |
| *C23C 16/30* | (2006.01) |
| *C23C 16/46* | (2006.01) |
| *H01J 37/32* | (2006.01) |
| *C30B 25/10* | (2006.01) |
| *C30B 29/46* | (2006.01) |
| *C30B 29/60* | (2006.01) |

(52) U.S. Cl.
CPC ...... *H01L 21/02568* (2013.01); *C23C 16/305* (2013.01); *C23C 16/46* (2013.01); *C23C 16/48* (2013.01); *C30B 25/105* (2013.01); *C30B 29/46* (2013.01); *C30B 29/60* (2013.01); *H01J 37/32321* (2013.01); *H01L 21/0262* (2013.01)

(58) Field of Classification Search
CPC ........... H01L 21/02; H01J 37/32; C23C 16/48
See application file for complete search history.

(56) References Cited

U.S. PATENT DOCUMENTS

| | | | |
|---|---|---|---|
| 2004/0089410 A1 | 5/2004 | Tenne et al. | |
| 2012/0003497 A1* | 1/2012 | Handy | B05D 1/60 428/615 |
| 2014/0251204 A1 | 9/2014 | Najmaei et al. | |
| 2015/0111392 A1* | 4/2015 | Ishii | H01L 21/02551 438/758 |

(Continued)

FOREIGN PATENT DOCUMENTS

| | | |
|---|---|---|
| CN | 101888974 A | 11/2010 |
| CN | 103480856 A | 1/2014 |

(Continued)

*Primary Examiner* — Caleb Henry
(74) *Attorney, Agent, or Firm* — Li & Cai Intellectual Property (USA) Office

(57) ABSTRACT

A method and apparatus for fabricating two-dimensional layered chalcogenide film are provided. A catalyst gas, a metal-based precursor gas and a chalcogen-based precursor gas are ionized with external stimuli to generate energetic particles which facilitate a chalcogen-substitution reaction of a metal-based precursor gas in a reaction chamber to form uniform two-dimensional layered chalcogenide film of at least a single crystalline layer via chemical vapor deposition.

11 Claims, 14 Drawing Sheets

(56) References Cited

U.S. PATENT DOCUMENTS

2015/0118487 A1* 4/2015 Wolden ............... C03C 17/3464
428/336
2016/0240719 A1* 8/2016 Lin .................... H01L 31/1129

FOREIGN PATENT DOCUMENTS

CN         103964507 A    8/2014
WO    WO 2009/034572 A1  3/2009

* cited by examiner

METHOD OF FABRICATING TWO-DIMENSIONAL LAYERED CHALCOGENIDE FILM

BACKGROUND OF THE INVENTION

1. Field of the Invention

The instant disclosure relates to a method and apparatus for fabricating two-dimensional layered chalcogenide film; in particular, to a chemical vapor deposition method and an apparatus for fabricating two-dimensional layered chalcogenide film.

2. Description of Related Art

Monolayer metal chalcogenides, specifically two-dimensional transition metal dichalcogenides, TMDs, have recently captured enormous attention in the field of optoelectronics, valleytronics, and spintronic since the discovery that monolayer semiconducting TMDs exhibit a direct bandgap, inviting novel manipulations of chemical, physical, and electrical properties of the transition metal dichalcogenides.

In the current fabrication of metal dichalcogenide films, chemical vapor deposition (CVD) at high temperature is usually required. Taking the formation of molybdenum disulfide ($MoS_2$) as an example, US application 2014/0251204 discloses that the reaction of $MoO_3$ vulcanization occurs at a temperature ranging from 800 to 1000° C. to form $MoS_2$ on a substrate.

However, during the high temperature CVD process, a substantial amount of chalcogens which have a relatively lower melting point compared to the transition metals tends to sublimate at such a high temperature. Thus, the chalcogens of the metal-based chalcogenide film might be lost. In addition, the evaporation of the chalcogens may result in a substantial amount of vacancies in the deposited metal-based chalcogenide film, which, in turn, affects the physical properties of the resulting metal-based chalcogenide film. Accordingly, the development of the low-temperature process to fabricate large-area and high-quality metal-based chalcogenide film has become a critical technique.

SUMMARY OF THE INVENTION

The objective of the instant disclosure in accordance with at least one embodiment is to provide a method and an apparatus of fabricating two-dimensional layered chalcogenide film. At least one external stimulus is used to ionize reactant gases and generate energetic particles so that the substitution reaction can take place at a lower process temperature during the chemical vapor deposition process.

In order to achieve the aforementioned objectives, a method of fabricating two-dimensional layered chalcogenide film is provided. The method includes the steps of heating a substrate to a reaction temperature; exposing the substrate to a catalyst gas, a metal-based precursor gas and a chalcogen-based precursor gas; ionizing the catalyst gas, the metal-based precursor gas and the chalcogen-based precursor gas by at least one external stimulus to generate energetic particles and to produce a metal chalcogenide; and reducing a substrate temperature so that the metal chalcogenide is deposited on the substrate to form a two-dimensional layered chalcogenide film.

According to an embodiment of the instant disclosure, an apparatus of fabricating two-dimensional layered chalcogenide film is provided. The apparatus includes a reaction chamber, a gas supply unit, a vacuum unit, and a setup of external stimuli. The gas supply unit is in fluid communication with the reaction chamber to at least supply a catalyst gas. The vacuum unit is in fluid communication with the reaction chamber to control the pressure of the reaction chamber. The setup of external stimuli is used to ionize the catalyst gas and the chalcogen-based precursor gas to generate energetic particles to facilitate a chalcogen-substitution reaction of a metal-based precursor gas taking place and to form a two-dimensional layered chalcogenide film on a surface of substrate.

The advantage of the method and the apparatus of fabricating two-dimensional layered chalcogenide film provided in an embodiment of the instant disclosure is that the chalcogen-substitution reaction can take place at lower reaction temperature by using at least one external stimulus to ionize the reactant gases and assist in the formation of the two-dimensional layered chalcogenide film.

In order to further understand the instant disclosure, the following embodiments and illustrations are provided. However, the detailed description and drawings are merely illustrative of the disclosure, rather than limiting the scope being defined by the appended claims and equivalents thereof.

DETAILED DESCRIPTION OF THE PREFERRED EMBODIMENTS

Figure 1:
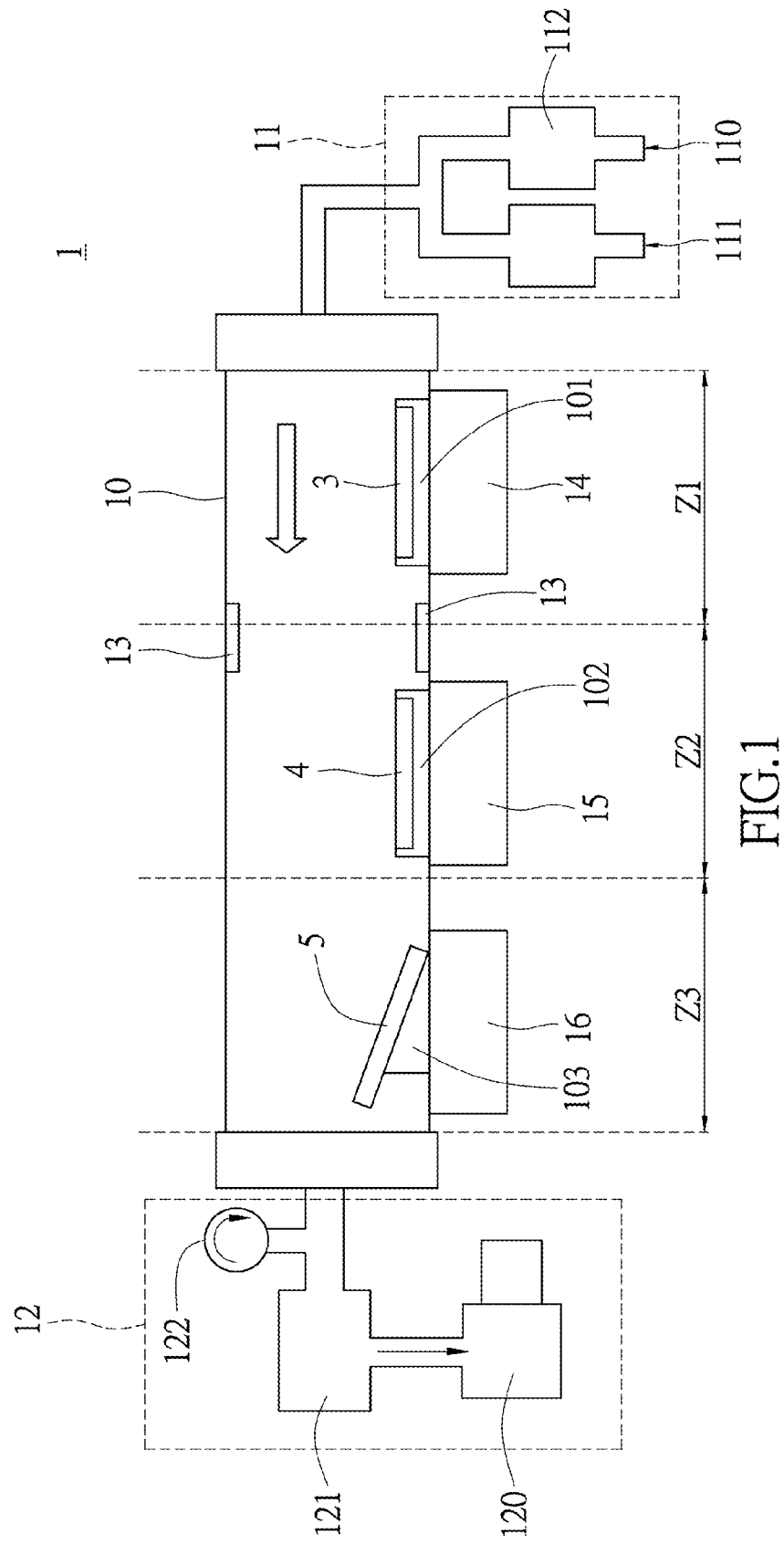
FIG. 1 is a schematic diagram illustrating an apparatus for a method of fabricating the two-dimensional layered chalcogenide film in accordance with an embodiment of the instant disclosure.

The aforementioned illustrations, descriptions, and advantages of various aspects of the inventions will be apparent from the subsequent descriptions of various concepts and embodiments within the broader scope of the inventions. Subject matter introduced above and discussed in greater detail below may be implemented in any of numerous ways, as the subject matter is not limited to any particular manner of implementation. Examples of specific implementations and applications below are provided primarily for illustrative purposes.

Unless otherwise defined, used or characterized herein, terminologies (technical and scientific terms) applied herein are to be interpreted as having a meaning that is consistent with their accepted meaning in the context of the relevant art and are not to be interpreted in an idealized manner unless expressly defined herein.

As applied in the instant disclosure, the singular forms, such as "a" and "an" are intended to include the plural forms as well, unless the context indicates otherwise. Additionally, the terms, "includes," "including," "comprises" and "comprising," indicate the presence of the stated elements or steps but do not preclude the addition of one or more other elements or steps.

Relative spatial terms, such as "above," "under," "top," "bottom", and the like, may be present in the instant disclosure to facilitate descriptions of relationships relative one element to another element(s) as illustrated in the figures. It shall be understood that the relative terms regarding spatial orientation, as well as the illustrated configurations, are intended to encompass various orientations of the apparatus during, prior to, or post operation in addition to the orientations described herein and depicted in the figures so long as the purpose of the device(s) or element(s) remain. For example, if an element in the figures is depicted as "bottom" or "under" another element(s) or device(s), then the element shall also be understood as being oriented "under" the other element or device only in the specified orientation in the specified embodiment, but the orientation of the device(s) or element(s) shall not be bounded by the specific orientation in the specific embodiment.

Further still, in this disclosure, when an element is referred to as being "on" or "connected to" another element, it may be directly on, connected or coupled to the other element or intervening elements may be present unless otherwise specified.

In an embodiment of the instant disclosure, the two-dimensional layered chalcogenide film is fabricated by chemical vapor deposition with an external stimulus or stimuli so that the required reaction temperature of the chalcogen substitution reaction can be lower. The apparatus for fabricating the two-dimensional layered chalcogenide film includes a reaction chamber, a gas supply unit, a vacuum setup, and a setup of external stimuli. The gas supply unit is in fluid communication with the reaction chamber to supply different reactant gases. The vacuum setup is in fluid communication with the reaction chamber to introduce a vacuum into the reaction chamber. The setup of external stimuli is used to provide at least one external stimulus to ionize the reactant gases to generate energetic particles.

FIG. 1 is a schematic diagram illustrating an apparatus for a method of fabricating the two-dimensional layered chalcogenide film in accordance with an embodiment of the instant disclosure. In the apparatus 1 of the instant embodiment, the reaction chamber 10 is a tube furnace, and the tube furnace can be made of suitably heat-resistant material, such as quartz.

In the instant embodiment, the interior of the reaction chamber 10 can be divided into a front zone Z1, a middle zone Z2, and a rear end zone Z3, which are respectively used to accommodate a chalcogen-based precursor 3, a metal-based precursor 4, and a substrate 5.

The chalcogen-based precursor 3 can be selected from the group consisting of sulfur, selenium, tellurium, and the combination thereof. In addition, the chalcogen-based precursor 3 can be in a solid-state or a gaseous state. In the embodiment of the instant disclosure, the chalcogen-based precursor 3 is solid state chalcogen-based precursor. In addition, the terms "metal-based" in the instant disclosure includes element, elements, or compound having transitional metals, transition metal oxides, and semiconductors as one of the essential source materials for the fabrication of the metal chalcogenides and are not intended to preclude the presence of addition of other materials. For example, the metal-based precursor 4 can be transition metal compounds, Group IIIA component or compounds, Group IVA component or compounds, or the combination thereof. The transition metal compounds can be a transition metal oxide, such as tungsten trioxide ($WO_3$), molybdenum trioxide ($MoO_3$), and so on. The substrate 5 can be made of sapphire, silicon-based material (such as silicon dioxide, glass, or quartz), aluminum oxide ($Al_2O_3$), mica plate or the other dielectric materials, and is not limited to the examples provided herein.

Furthermore, the term "chalcogenides" include dichalcogenides, trichalcogenides, and do not preclude chalcogenides having more than one chalcogen atom. Moreover, the dichalcogenide has a composition generally represented by a formula, MX2, where M is a metal based precursor, and X is a chalcogen such as sulfur, selenium, tellurium, and the combination thereof, and the chalcogens are not limited to the examples provided herein. For example, the two-dimensional layered chalcogenide film synthesized from the abovementioned precursors (the metal-based precursor and the chalcogen-based precursor) can be transition metal dichalcogenides (TMDs), III-VI compound semiconductors, or II-VI compound semiconductors. The transition metal dichalcogenides can be $MoS_2$, $MoSe_2$, $MoTe_2$, $HfS_2$, $HfSe_2$, $HfTe_2$, $WS_2$, $WSe_2$, $WTe_2$, $NbS_2$, $NbSe_2$, $NbTe_2$, $ReS_2$, $ReSe_2$, $ReTe_2$, and so on. The III-VI compound semiconductors may be GaS, GaSe, GaTe, $In_2S_3$, $In_2Se_3$, or $In_2Te_3$. The IV-VI compound semiconductors may be GeSe, or GeTe.

In the embodiment of the instant disclosure, the apparatus of fabricating the two-dimensional layered chalcogenide film can further includes a first supporting boat 101, a second supporting boat 102, and a holder 103 to respectively contain the chalcogen-based precursor 3, the metal-based precursor 4, and the substrate 5. Notably, the substrate 5 is placed at the rear end zone Z3, and held on the holder 103 so that a predetermined deposition surface is inclined and faces to the front zone Z1.

The gas supply unit 11 is in fluid communication with the reaction chamber 10 to introduce different reactant gases into the reaction chamber 10. In the instant embodiment, the gas supply unit 11 is set at one open end of the reaction chamber 10 near the front zone Z1. The gas supply unit 11 can introduce a catalyst gas 110 and a carrier gas 111 into the reaction chamber 10. The catalyst gas 110 in the instant embodiment can be hydrogen gas, and the carrier gas 111 can be inert gas, such as argon or nitrogen gas. In addition, the gas supply unit 11 can further include two flow control valves 112 for respectively controlling the flows of the catalyst gas 110 and the carrier gas 111.

The vacuum unit 12 is in fluid communication with another open end of reaction chamber 10 near the rear end zone Z3 to introduce a vacuum into the reaction chamber 10. During the deposition process, the vacuum setup 12 draws the gases from the reaction chamber 10 so as to maintain the pressure within the reaction chamber 10 at a predetermined value. Specifically, the vacuum unit 12 includes a vacuum pump 120, a regulator valve 121, and a vacuum gauge 122. The vacuum pump 120 is set up to create a vacuum in the reaction chamber 10. The vacuum gauge 122 and the regulator valve 121 are used to respectively monitor and control the pressure inside the reaction chamber 10. It is worth noting that because the vacuum unit 12 is arranged near the rear end zone Z3, in which the substrate 5 is placed, the arrangement of the vacuum unit 12 can facilitate film deposition onto the substrate 5.

In the instant embodiment, the apparatus 1 further includes a first heater 14, the second heater 15, and the third heater 16 to respectively heat the front zone Z1, the middle zone Z2, and the rear end zone Z3. That is, the chalcogen-based precursor 3, the metal-based precursor 4, and the substrate 5, which are respectively placed in the front zone Z1, the middle zone Z2, and the rear end zone Z3, can be heated independently and respectively by the first heater 14, the second heater 15, and the third heater 16. Accordingly, the chalcogen-based precursor 3, the metal-based precursor 4, and the substrate 5 can be heated simultaneously with different heating rates to have different temperatures.

Specifically, after the substrate 5, the chalcogen-based precursor 3, the metal-based precursor 4 are placed in the reaction chamber 10, the chalcogen-based precursor 3 is heated up to reach a first initial temperature by the first heater 14. When the chalcogen-based precursor 3 is in solid state, the chalcogen-based precursor 3 is vaporized from solid state to gaseous state to generate the chalcogen-based precursor gas. Similarly, the metal-based precursor 4 can be heated by the second heater 15 to reach a second initial temperature to generate the metal-based precursor gas. The substrate 5 can be heated to reach a reaction temperature by the third heater 16. The aforementioned heating steps can be performed synchronously.

Additionally, by individually adjusting the output powers of the first heater 14, the second heater 15, and the third heater 16, the temperatures of the substrate 5, the chalcogen-based precursor 3, and the metal-based precursor 4 can be controlled independently. For example, when the output powers of the second and third heaters 15, 16 are decreased to reduce the temperatures of the substrate 5 and the metal-based precursor 4, the output power of the first heater 14 can be maintained so that only the temperature of the chalcogen-based precursor 3 is kept within a predetermined growth duration.

As for the setup of external stimuli 13, an ultraviolet (UV) light source, a plasma generator, or a combination thereof can be applied to provide the external stimulus or stimuli. In the instant embodiment, the setup of external stimuli 13 can be the plasma generator, arranged in the reaction chamber 10, and located between the front zone Z1 and the middle zone Z2. After the catalyst gas 110 and the carrier gas 111 are introduced into the reaction chamber 10, and the chalcogen-based precursor gas and the metal-based precursor gas are generated, the setup of external stimuli 13 can be turned on to ionize the catalyst gas 110 and the chalcogen-based precursor gas to facilitate the generation of the energetic particles. The energetic particles include free radicals, photons, and charged particles (such as hydrogen ions and chalcogen ions).

For example, if the catalyst gas 110 is hydrogen gas, and the chalcogen-based precursor 3 is selenium, the charged particles include hydrogen ions ($H^+$) and selenium ions ($Se^{2-}$). These energetic particles would facilitate the occurrence of the chalcogen-substitution reaction on the metal-based precursor gas to produce the chalcogenide compound. For example, when the catalyst gas is hydrogen, and the metal-based precursor gas is vaporized tungsten trioxide ($WO_3$), and the chalcogen-based precursor gas is selenium, the ionized catalyst gas and the chalcogen-based precursor gas can facilitate the vaporized tungsten trioxide to be selenized at relatively lower temperatures and then produce gas-phase tungsten diselenide ($WSe_2$).

The majority of the abovementioned selenization generally occurs at the middle zone Z2 of the reaction chamber 10. The gas-phase tungsten diselenide can be transported by the carrier gas 111 to the rear end zone Z3 and deposited on the substrate 5 to form a plurality of tungsten diselenide grains or a tungsten diselenide film.

Notably, under conditions without using the setup of external stimuli 13, the reaction temperature of the substrate 5 has to be raised to higher than 800° C. to selenize the vaporized tungsten trioxide and to produce the tungsten diselenide. In the instant embodiment, even if the reaction temperature of the substrate 5 is lowered down to a range between 100 to 700° C., the selenization still can take place because of the use of the setup of external stimuli 13. As such, the situation that the deposited two-dimensional layered chalcogenide film is vaporized again due to the higher reaction temperature of the substrate 5 can be attenuated. Additionally, compared with the process without using the setup of external stimuli, the substrate 5 of the instant embodiment does not have to be made of heat-resistant material and has a higher selectivity due to the reduced temperature.

Figure 2:
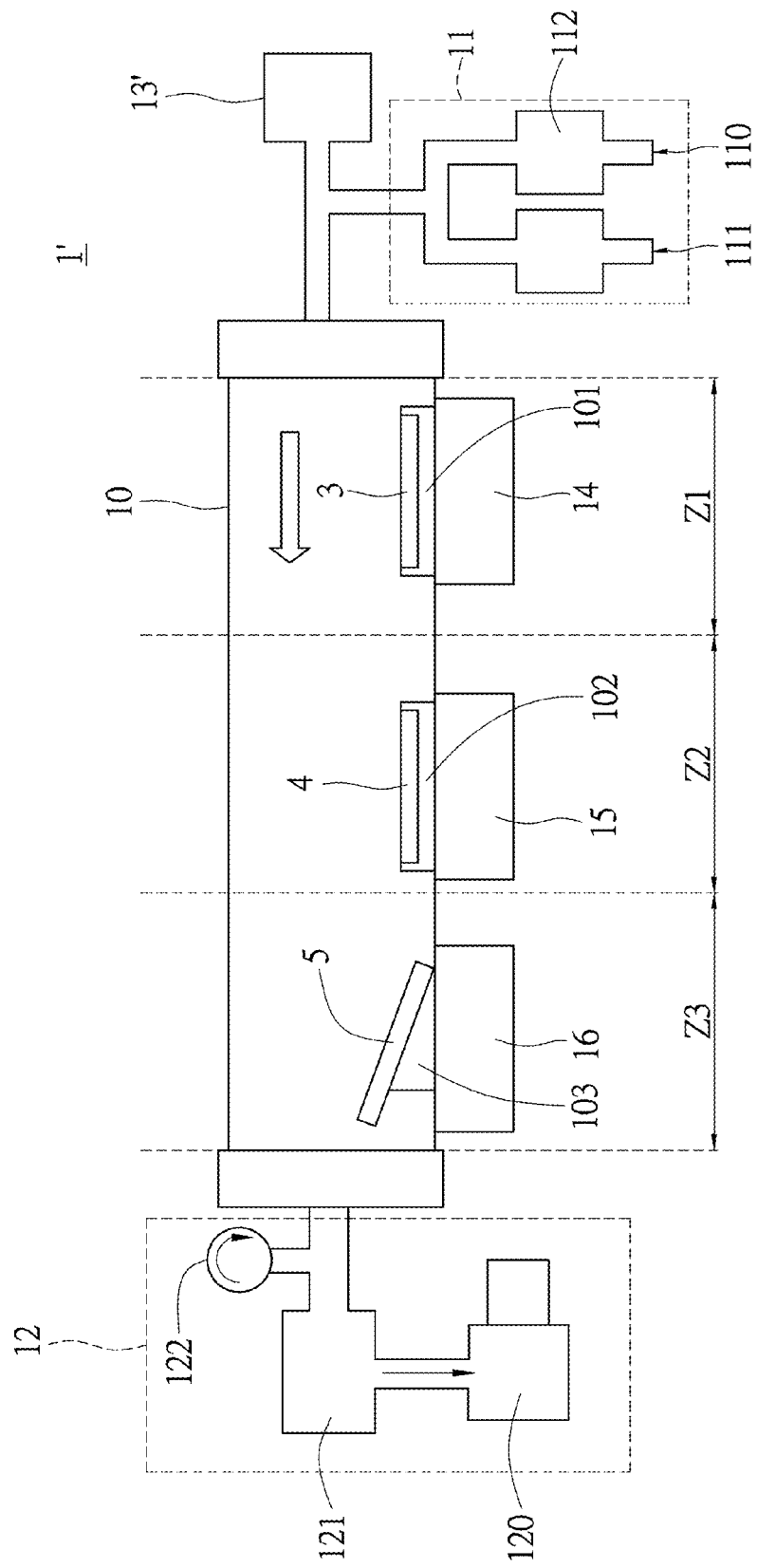
FIG. 2 is a schematic diagram illustrating the apparatus for a method of fabricating the two-dimensional layered chalcogenide film in accordance with another embodiment of the instant disclosure.

FIG. 2 is a schematic diagram illustrating the apparatus for a method of fabricating the two-dimensional layered chalcogenide film in accordance with another embodiment of the instant disclosure. The same reference numerals are given to the same components or to components corresponding to those in FIG. 1, and descriptions of the common portions are omitted.

The setup of external stimuli 13', as shown in FIG. 2 for apparatus 1', is the ultraviolet (UV) light source, with location disposed at the outside of the reaction chamber 10. The UV light source is used to emit a UV light which has a wavelength ranging from 160 nm to 400 nm. The UV light can ionize the catalyst gas 110 and the chalcogen-based precursor gas so that the temperature required for chalcogen-substitution reaction can be reduced, with similar deposition results facilitated by plasma. In another embodiment, the setup of external stimuli can include both of the plasma generator and the UV light source.

Figure 3:
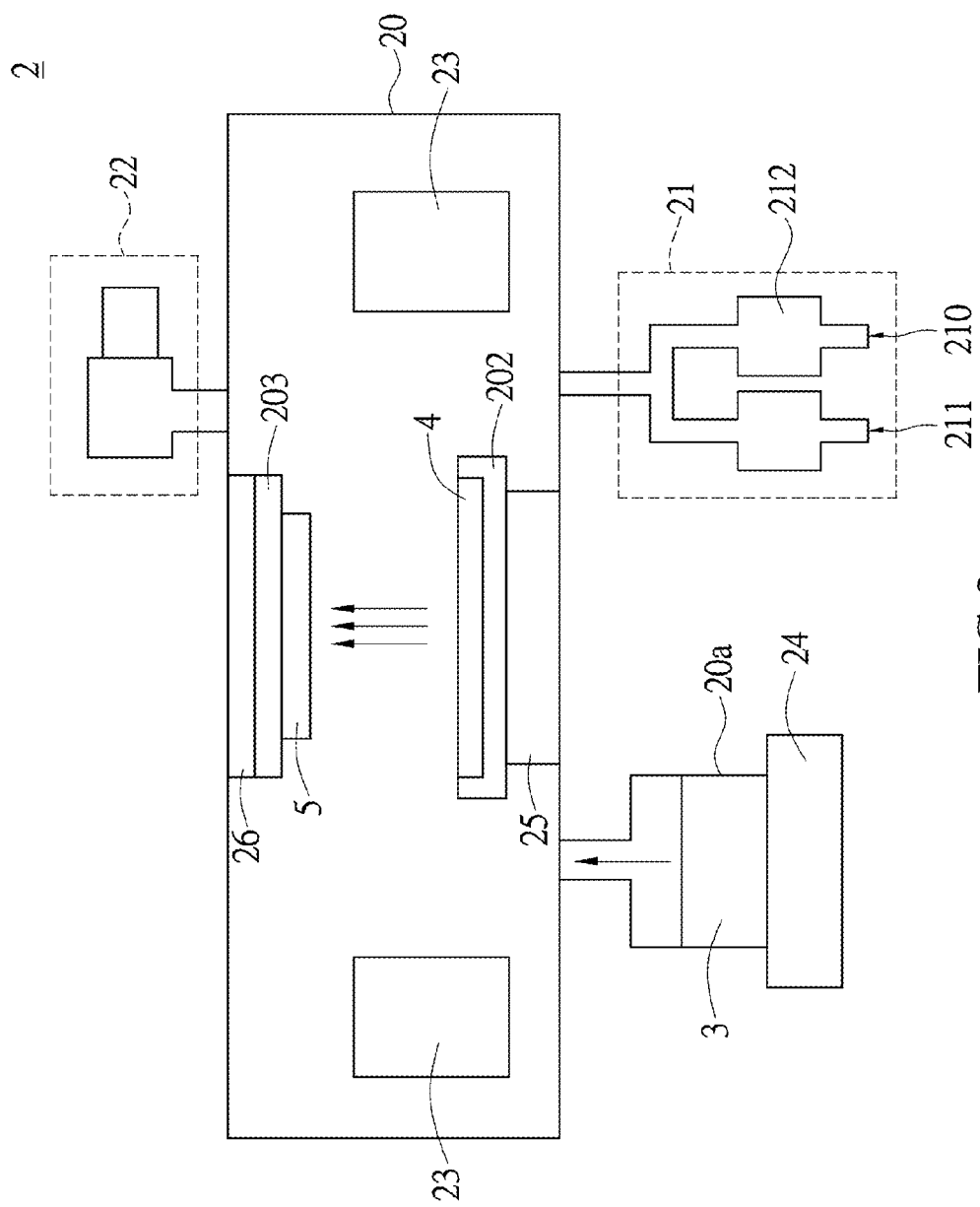
FIG. 3 is a schematic diagram illustrating the apparatus for a method of fabricating the two-dimensional layered chalcogenide film in accordance with another embodiment of the instant disclosure.

FIG. 3 is a schematic diagram illustrating the apparatus for a method of fabricating the two-dimensional layered chalcogenide film in accordance with another embodiment of the instant disclosure. The apparatus 2 of the instant embodiment includes a reaction chamber 20, a gas supply unit 21, a vacuum unit 22, and a setup of external stimuli 23.

In the instant embodiment, the reaction chamber 20 is a "cold-wall" chamber. Both the gas supply unit 21 and the vacuum unit 22 are in fluid communication with the reaction chamber 20 and respectively located at two opposite sides of the reaction chamber 20. Specifically, the vacuum unit 22 is connected to an open end at an upper side of the reaction chamber 20, and the gas supply unit 21 is connected to another open end at a lower side of the reaction chamber 20. Similar to the embodiment shown in FIG. 1, the gas supply unit 21 can supply the catalyst gas 210 and the carrier gas 211. The apparatus 2 further includes a first sub-chamber 20a where the chalcogen-based precursor 3 is installed and is in fluid communication with the reaction chamber 20. The holder 203 and the supporting boat 202 are arranged respectively inside the reaction chamber 20 for respectively holding the substrate 5 and containing the metal-based precursor 4.

The holder 203 is arranged at one side of the chamber 20 and close to the vacuum unit 22, while the supporting boat 202 is arranged at another side of the chamber 20 and close to the gas supply unit 21. That is, when the substrate 5 is held on the holder 203, and the metal-based precursor 4 is contained in the supporting boat 202, a predetermined deposition surface of the substrate 5 is arranged facing to the metal-based precursor 4.

In the instant embodiment, the apparatus 2 includes three heaters 24-26. The heater 24 is disposed in the first sub-chamber 20a for heating the chalcogen-based precursor 3 and generating the chalcogen-based precursor gas. The heater 25 and 26 are both arranged inside the reaction chamber 20. The heater 25 is located under the supporting boat 202 and used to generate the metal-based precursor gas. The heater 26 is in direct contact with holder 203 so as to heat the substrate 5. Furthermore, in the embodiment shown in FIG. 3, the setup of external stimuli 23 includes the plasma generator arranged inside the reaction chamber 20.

Figure 4:
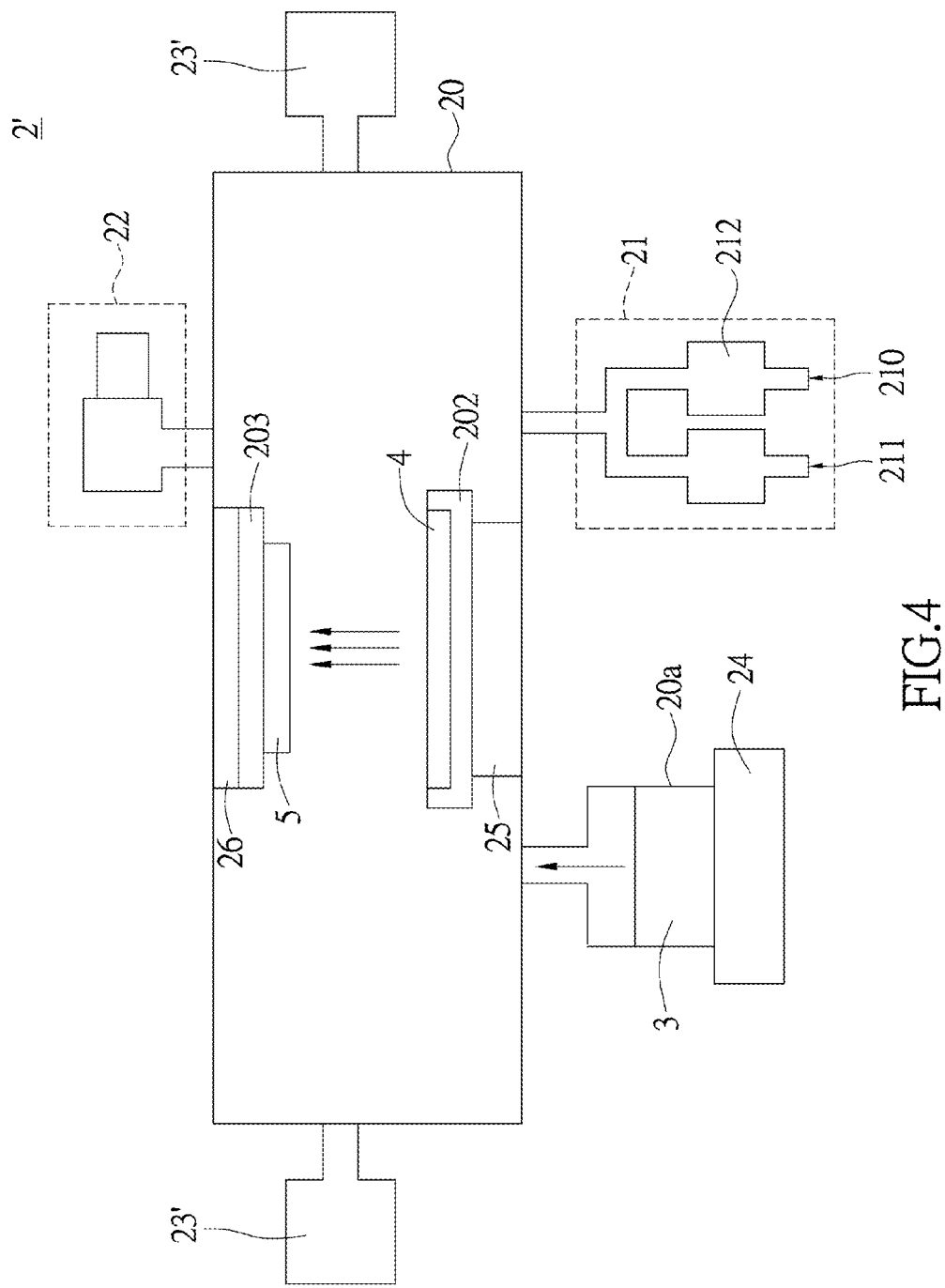
FIG. 4 is a schematic diagram illustrating the apparatus for a method of fabricating the two-dimensional layered chalcogenide film in accordance with another embodiment of the instant disclosure.
Figure 4A:
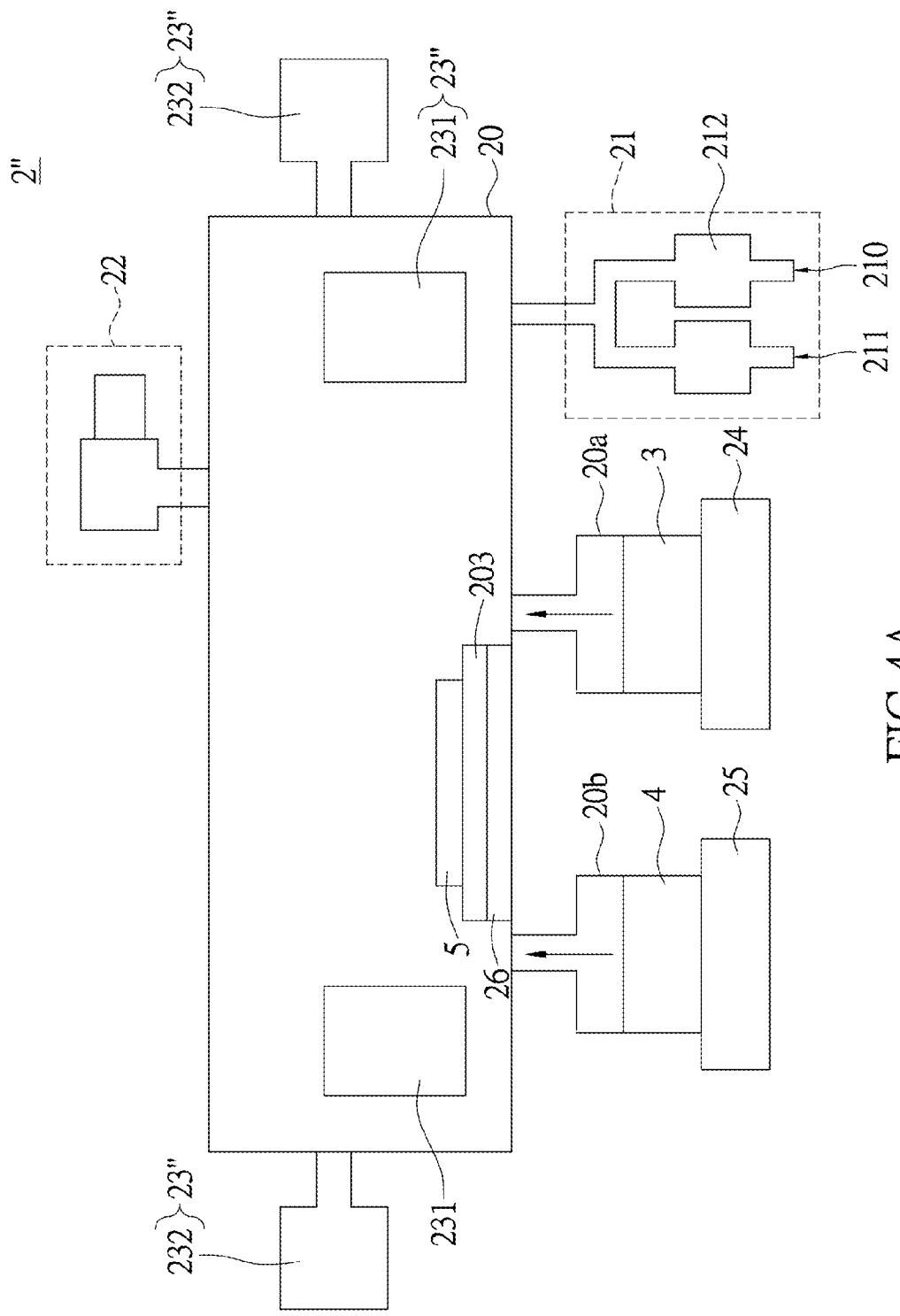
FIG. 4A is a schematic diagram illustrating the apparatus for a method of fabricating the two-dimensional layered chalcogenide film in accordance with another embodiment of the instant disclosure.

Please refer to FIG. 4 and FIG. 4A. FIG. 4 and FIG. 4A respectively show schematic diagrams illustrating the apparatus for a method of fabricating the two-dimensional layered chalcogenide film in accordance with another embodiments of the instant disclosure. In the embodiment shown in FIG. 4, the setup of external stimuli 23' includes the UV light source, which is arranged outside the reaction chamber 20. The UV light source can emit UV light to ionize the catalyst gas 210 and the chalcogen-based precursor gas.

In another embodiment shown in FIG. 4A, the setup of external stimuli 23" includes both the plasma generator 231 and the UV light source 232, which can be turned on alternately or simultaneously during the growth process of the two-dimensional layered chalcogenide film. Additionally, as shown in FIG. 4A, the apparatus 2" includes the first sub-chamber 20a and a second sub-chamber 20b. The second sub-chamber 20b is in fluid communication with the reaction chamber 20, and the metal-based precursor 4 is installed in the second-sub chamber 20b. In this embodiment, the heater 25 is also arranged in the second sub-chamber 20b for heating the metal-based precursor 4 so that the metal-based precursor gas can be produced and introduced into the reaction chamber 20.

Notably, in the embodiments shown in FIG. 1 and FIG. 2, during the heating process of the substrate 5, the metal-based precursor 4, and the chalcogen-based precursor 3, the walls of the reaction chambers 1 and 1' are also heated simultaneously. As such, impurities or particles adsorbed on the inner walls of the reaction chambers 1 and 1' might desorb and cause contaminations to the substrate 5 where the chalcogenide film grows. In contrast, in the embodiments shown in FIGS. 3, 4, and 4A, the substrate 5, the metal-based precursor 4, and the chalcogen-based precursor 3 in the apparatus 2, 2', 2" can be heated independently without additionally heating the reaction chamber 20, possible impurity and particle contaminations from the chamber walls can be minimized.

Figure 5:
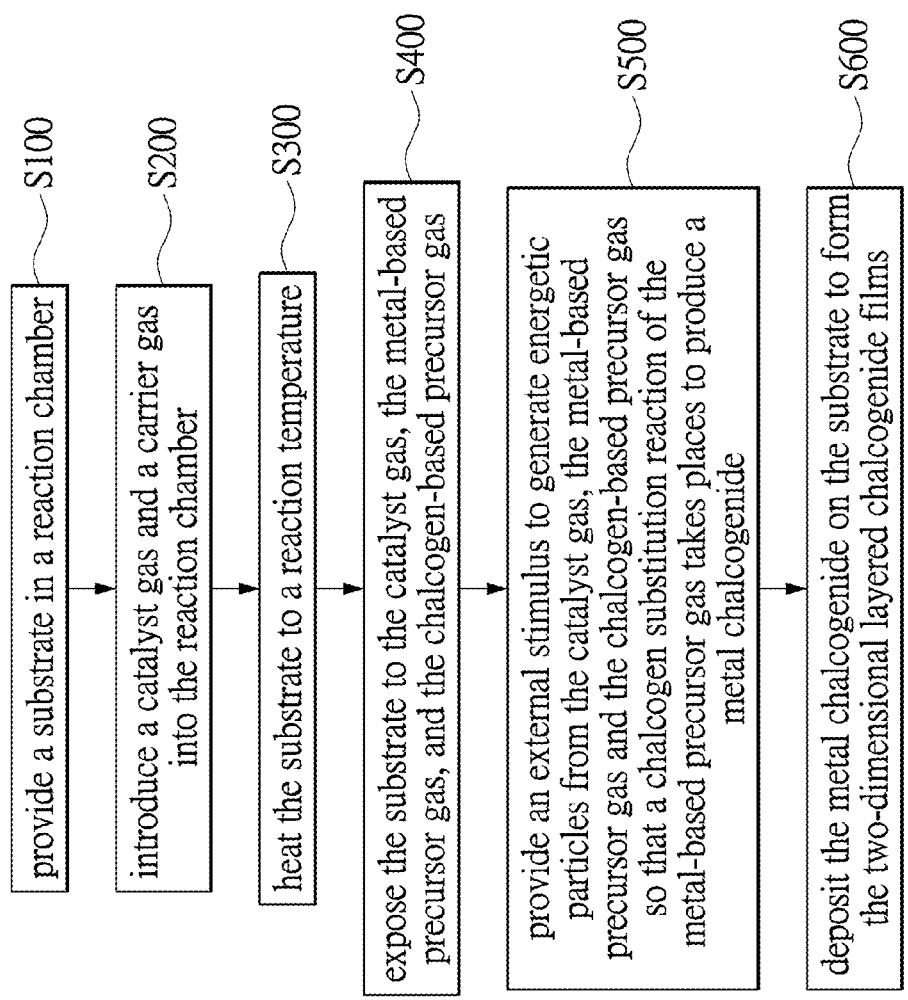
FIG. 5 is a flow chart of the method of fabricating the two-dimensional layered chalcogenide film in accordance with an embodiment of the instant disclosure.

A method of fabricating the two-dimensional layered chalcogenide film is also provided in an embodiment of the instant disclosure. FIG. 5 is a flow chart of the method of fabricating the two-dimensional layered chalcogenide film in accordance with an embodiment of the instant disclosure. In addition, the method of fabricating the two-dimensional layered chalcogenide film can be performed by using one of the apparatus shown in FIG. 1 to FIG. 4.

Firstly, in step S100, a substrate is placed in a reaction chamber. The reaction chamber can be the reaction chamber 10 or 20 shown in FIG. 1 or FIG. 3. The substrate can be selected from sapphire, silicon-based material (such as silicon, silicon dioxide, silicon nitride, or glass), aluminum oxide ($Al_2O_3$), mica plate, or the other dielectric materials, which is not limited to the examples provided herein.

In step S200, a catalyst gas and a carrier gas are introduced into the reaction chamber. In one embodiment, the pressure in the reaction chamber is raised to a level ranging from 10 to 30 torr. The catalyst gas in the instant embodiment can be hydrogen, and the carrier gas can be argon or nitrogen. The catalyst gas can facilitate chalcogen-substitution reaction. The aforementioned chalcogen-substitution reaction can be sulfurization, selenization, or tellurization.

In step S300, the substrate is heated to a reaction temperature. In one embodiment, the reaction temperature ranges from 100 to 700° C., which can be varied according to the characteristics of two-dimensional layered chalcogenide film deposited. In one embodiment, when the deposited two-dimensional layered chalcogenide film is tungsten diselenide, the reaction temperature can be set between 500 to 700° C.

Subsequently, in step S400, the substrate is exposed to the catalyst gas, the metal-based precursor gas, and the chalcogen-based precursor gas. In one embodiment, the step of exposing the substrate to the catalyst gas, the metal-based precursor gas, and the chalcogen-based precursor gas includes the steps of heating a chalcogen-based precursor to a first initial temperature so as to produce the chalcogen-based precursor gas, and heating a metal-based precursor to a second initial temperature so as to produce the metal-based precursor gas.

Additionally, it is worth noting that the step S400 and the step S300 can be performed synchronously. Specifically, the substrate 5, the chalcogen-based precursor 3, and the metal-based precursor 4 can be heated separately to preset temperatures simultaneously with different heating rates. That is to say, the chalcogen-based precursor 3 arranged in the sub-chamber 20a can be heated up to the first initial temperature before the steps of heating the substrate 5 and the metal-based precursor 4. Accordingly, the sequences of heating the substrate 5, the metal-based precursor 4, and the chalcogen-based precursor 3 and the temperature rising time can be adjusted according to the demands of the fabrications, and does not be limited in the instant disclosure.

Subsequently, in step S500, an external stimulus is provided to generate energetic particles from the catalyst gas, the metal-based precursor gas and the chalcogen-based precursor gas, in which the energetic particles facilitate the reaction of chalcogen substitution on the metal-based precursor gas to produce metal chalcogenide.

The external stimulus can be plasma or UV light. In another embodiment, the plasma and the UV light can be used together. In one case, the external stimulus is the UV light used to ionize the introduced gases, which include the catalyst gas, the metal-based precursor and the chalcogen-based precursor gas. The UV light has a wavelength ranging from 160 nm to 400 nm. The high energy of the UV light may also damage the two-dimensional layered chalcogenide film deposited on the substrate. As such, when the external stimulus is UV light, the step of providing the external stimulus can further include intermittently turning on and off the UV light for a predetermined reaction time interval.

Specifically, within the predetermined reaction time, the UV light is alternatively turned on and off to avoid damage of the deposited two-dimensional layered chalcogen films. Furthermore, the UV light source is periodically turned on and off within the predetermined reaction time.

In another embodiment, when the external stimulus is plasma, the plasma is turned on continuously within the predetermined reaction time.

In step S600, the metal chalcogenide produced during the step S500 is transported by the carrier gas to the substrate and deposited thereon. Furthermore, in the step, the metal chalcogenide transported to the substrate can be deposited on the substrate by reducing the substrate temperature. The relatively lower substrate temperature can prevent the two-dimensional layered chalcogenide film, which has been deposited on the substrate, from being vaporized again.

When the substrate temperature is reduced, the supply of the metal-based precursor gas is also decreased. In one embodiment, if the metal-based precursor gas is generated by heating the metal-based precursor, the metal-based precursor gas can be decreased by lowering the heating temperature of the metal-based precursor.

In one embodiment, when the substrate temperature begins to reduce, the chalcogen-based precursor gas and the catalyst gas are maintained at a preset value for a predetermined growth duration. This is because the chalcogen atoms in the deposited two-dimensional layered chalcogenide film might escape when the substrate temperature remains high, resulting in a large amount of vacancies in the deposited two-dimensional layered chalcogenide film. Therefore, when the substrate temperature is decreased, the supply of the chalcogen-based precursor gas and the catalyst gas are still maintained in order to attenuate the generation of the chalcogen vacancies in the two-dimensional layered chalcogenide film.

When the chalcogen-based precursor gas and the catalyst gas begin to reduce, the total pressure in the reaction chamber is maintained at a preset value by increasing the amount of carrier gas.

Hydrogen can react with chalcogen atoms, forming hydrogen sulfide, hydrogen selenide, or hydrogen telluride. Accordingly, the step of decreasing the supply of the chalcogen-based precursor gas is performed simultaneously with the decrease of catalyst gas, so that the deposited two-dimensional layered chalcogenide film will not be etched by excess hydrogen.

Figure 6A:
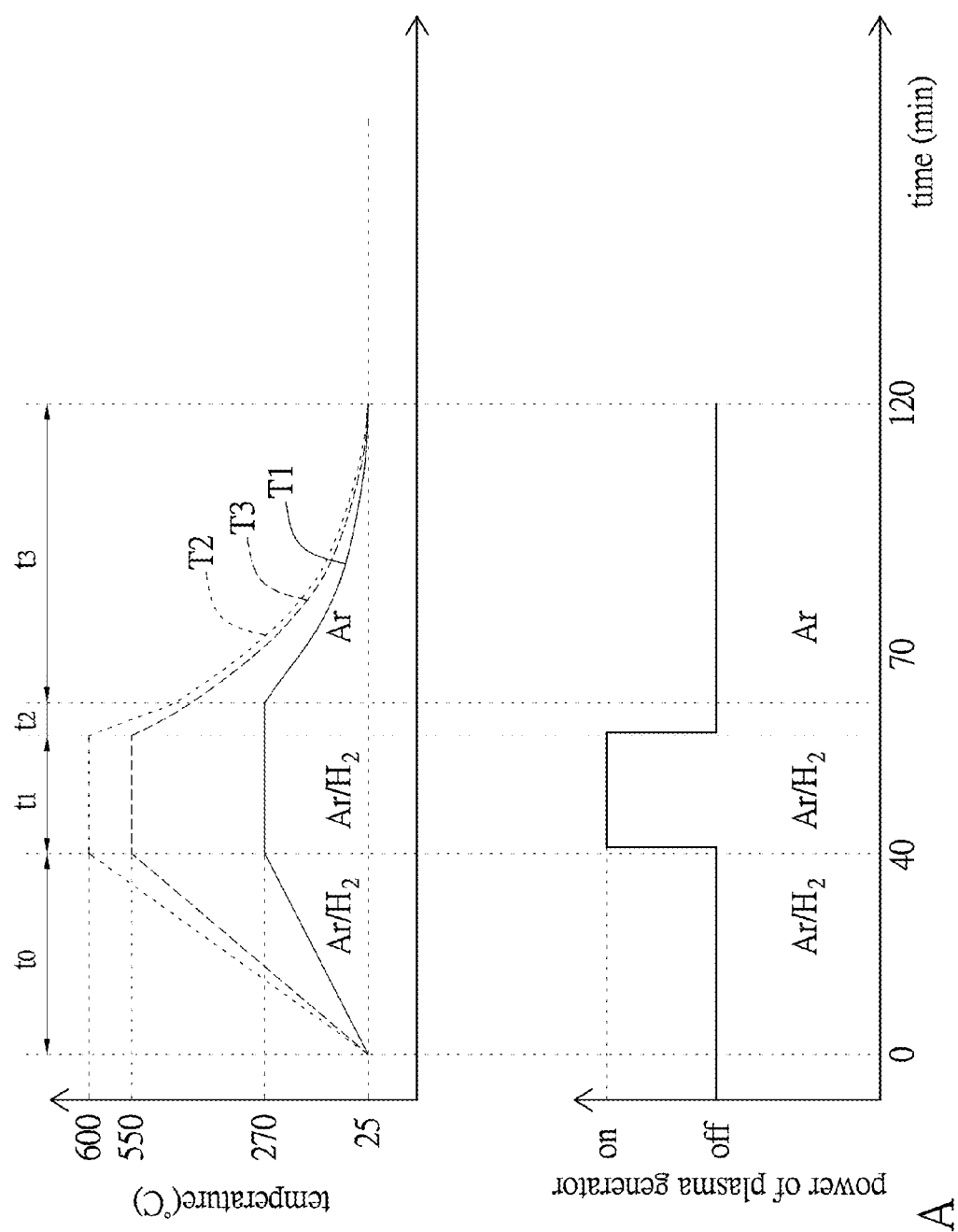
FIG. 6A shows a diagram schematically illustrating temperature-time curves of the substrate, the metal-based precursor, and the chalcogen-based precursor, and also illustrating the output power of the plasma generator as a function of time during a method of fabricating two-dimensional layered chalcogenide film in accordance with another embodiment of the instant disclosure.

FIG. 6A shows a diagram schematically illustrating temperature-time curves of the substrate, the metal-based precursor, and the chalcogen-based precursor. It also illustrates the output power of the plasma generator as a function of growth time during a method of fabricating two-dimensional layered chalcogenide film in accordance with another embodiment of the instant disclosure. In the instant embodiment, the apparatus 1 shown in FIG. 1 is taken as an example to describe the fabrication of the single-crystal two-dimensional monolayer tungsten diselenide ($WSe_2$) in details provided in the instant disclosure.

The chalcogen-based precursor 3, the metal-based precursor 4, and the substrate 5 are transferred into the reaction chamber 10, and the catalyst gas 110 and the carrier gas 111 are introduced into the reaction chamber 10 so that the pressure in the reaction chamber 10 is maintained at a range between 10 to 30 torr. The time-temperature curves T1, T2, and T3 illustrated in FIG. 6A respectively show the temperature of chalcogen-based precursor, the temperature of metal-based precursor 4 and the substrate temperature during the fabrication process. In the instant embodiment, the metal-based precursor 4 is tungsten trioxide, and the chalcogen-based precursor 3 is selenium.

Specifically, the chalcogen-based precursor 3, the metal-based precursor 4, and the substrate 5 are heated synchronously within the first period t0. The chalcogen-based precursor 3 is heated up to a first initial temperature to generate the chalcogen-based precursor gas, the metal-based precursor 4 is heated up to a second initial temperature to generate the metal-based precursor gas, and the substrate 5 is heated up to a reaction temperature. In this embodiment, the first initial temperature can be set about 250 to 270° C., the second initial temperature can be set about 550 to 700° C., and the reaction temperature can be set about 300 to 550° C.

Subsequently, the external stimulus is provided, i.e., the plasma generator is turned on, at a start of a second stage t1, so as to facilitate the reactions among the chalcogen-based precursor gas, the metal-based precursor gas, and the catalyst gas. At the same stage t1, the temperature T1 of chalcogen-based precursor, the temperature T2 of the metal-based precursor 4 and the substrate temperature T3 are, respectively, kept constant.

In the stage t2, the substrate temperature T3 and the temperature T2 of the metal-based precursor start to be reduced, so that the metal chalcogenide produced at the stage t1 can be deposited on the substrate 5. Moreover, the temperature T1 of the chalcogen-based precursor is unchanged until the start of the stage t3.

As mentioned previously, the chalcogen atoms in the deposited two-dimensional layered chalcogenide film tend to escape the lattice at high growth temperature. Therefore, keeping the temperature T1 of the chalcogen-based precursor constant at the stage t2 can effectively reduce the formation of chalcogen vacancies in the deposited two-dimensional layered chalcogenide film.

Additionally, the setup of external stimuli, i.e., the plasma generator, is turned off at the end of the stage t1 to stop the plasma and prevent the deposited two-dimensional layered chalcogenide film on the substrate 5 from being damaged by the external stimulus.

The temperature T1 of the chalcogen-based precursor is gradually reduced after the stage t2 to decrease the supply of the chalcogen-based precursor gas. The temperature T1 of the chalcogen-based precursor, the temperature T2 of the metal-based precursor, and the substrate temperature T3 are decreased to room temperature at the stage t3. It is worth noting that the supply of the catalyst gas is decreased at the stage t3, while the supply of the carrier gas is increased at the stage t3 to maintain the chamber pressure.

It is worth noting that in other embodiments, the supply of the metal-based precursor gas and the chalcogen-based precursor gas can also be stored in different gas tanks, both of which are in fluid communication with the reaction chamber. In addition, the supply of the metal-based precursor gas and the chalcogen-based precursor gas can be controlled separately through different mass flow controllers. Thus, when the substrate temperature T3 begins to be reduced at the stage t2, the mass flow controllers can be regulated to reduce the supply of the metal-based precursor gas and to keep the supply of the chalcogen-based precursor gas unchanged so as to minimize the formation of chalcogen vacancies.

Figure 6B:
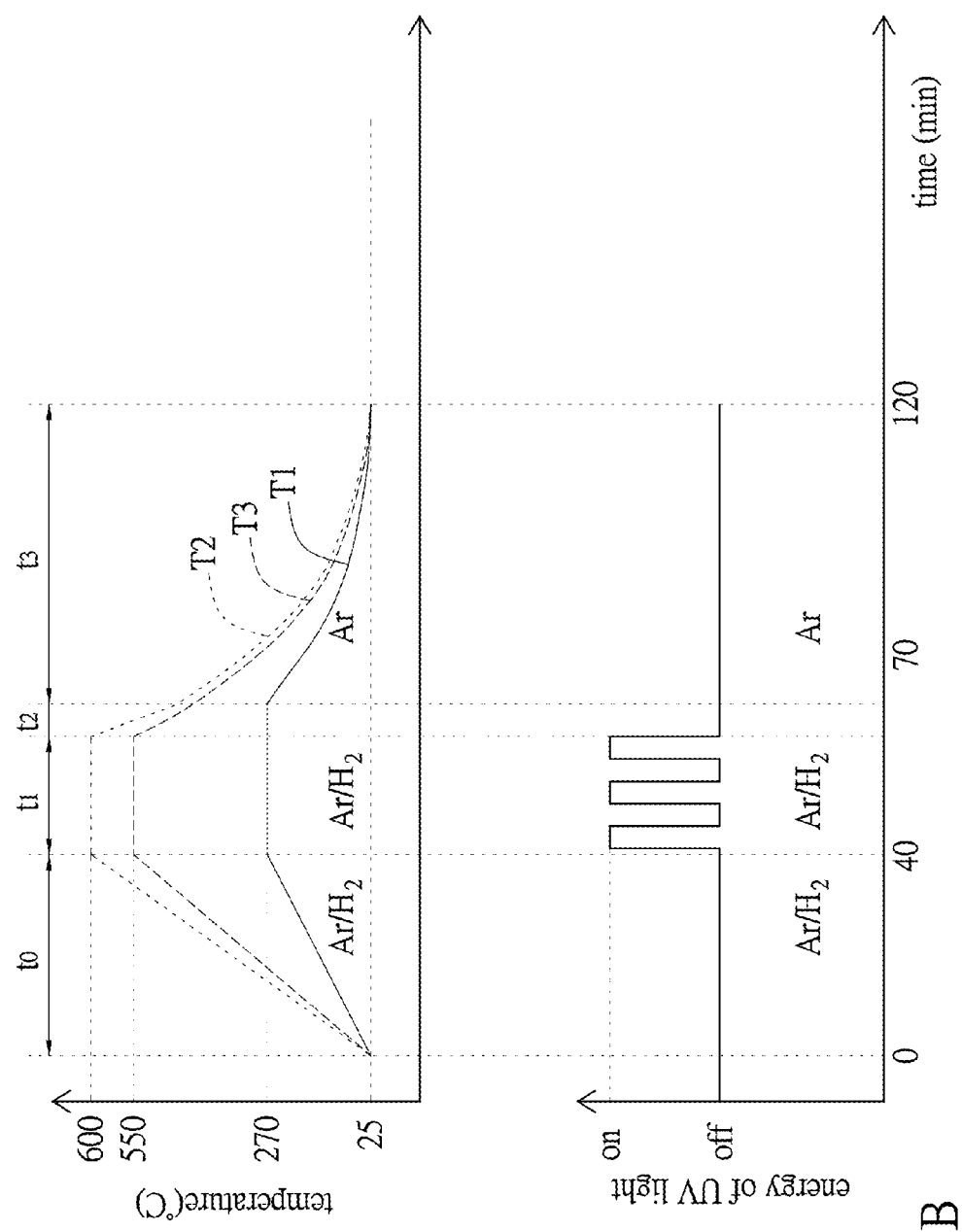
FIG. 6B shows a diagram illustrating temperature-time curves of the substrate, the metal-based precursor, and the chalcogen-based precursor, and also illustrating the on/off state of the UV light source at every time period during a method of fabricating the two-dimensional layered chalcogenide film in accordance with another embodiment of the instant disclosure.

FIG. 6B shows a diagram illustrating temperature-time curves of the substrate, the metal-based precursor, and the chalcogen-based precursor during a method of fabricating the two-dimensional layered chalcogenide film in accordance with another embodiment of the instant disclosure. FIG. 6B also illustrates the on/off states of the UV light at the stage t1. In this case, the apparatus 1' shown in FIG. 2 is taken as an example to describe the method of fabricating the two-dimensional layered chalcogenide film, and the external stimulus is UV light. As shown in FIG. 6B, the temperature-time curves of the chalcogen-based precursor 3, the metal-based precursor 4, and the substrate 5 are similar to those shown in FIG. 6A. The difference between FIG. 6A and FIG. 6B is that the external stimulus, i.e., the UV light, is intermittently turned on and off at the stage t1 to create energetic particles and also to minimize potential damage to the deposited two-dimensional layered chalcogenide film.

Figure 7:
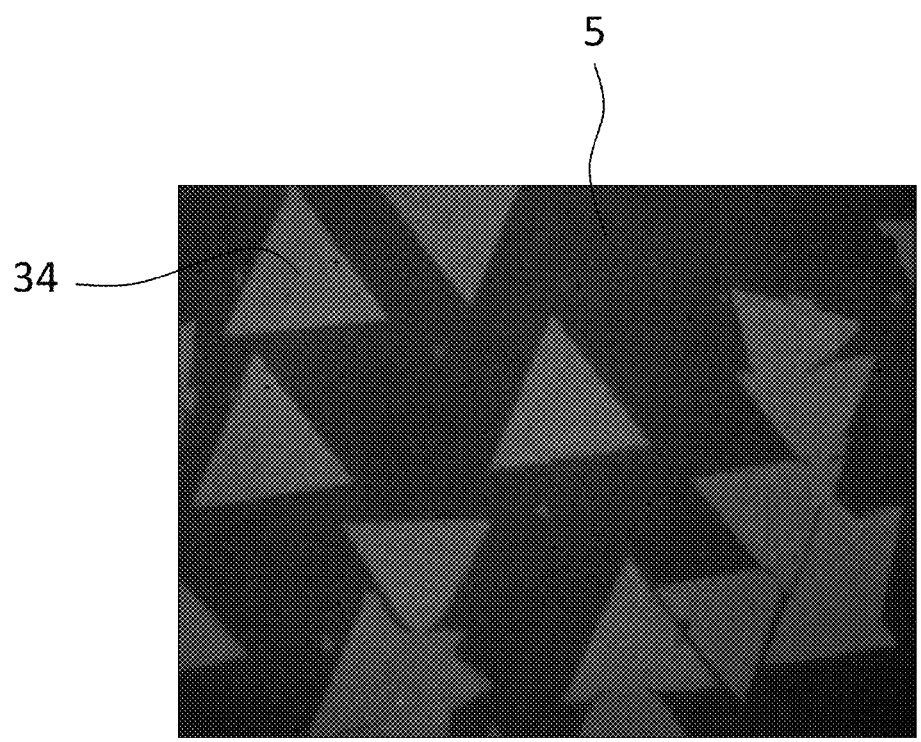
FIG. 7 is an optical microscopic image of the single-crystal two-dimensional monolayer tungsten diselenide ($WSe_2$) fabricated by a method in accordance with the instant disclosure.

FIG. 7 is an optical microscopic image of two-dimensional single-crystal monolayer tungsten diselenide ($WSe_2$) fabricated by a method in accordance of the instant disclosure. Specifically, FIG. 7 illustrates the two-dimensional layered chalcogenide film 34 deposited on the substrate 5 based on the embodiment shown in FIG. 6B. As shown in FIG. 7, the single-crystal $WSe_2$, which has triangular shape, is formed on the substrate 5 through the fabricating process shown in FIG. 6B even though the growth temperature of the substrate 5 is only about 550° C.

The grain size of the two-dimensional layered chalcogenide film 34 depends on the time of the stage t1. In general, the longer the stage t1 is, the larger gain size the two-dimensional layered chalcogenide film 34 have.

Figure 8A:
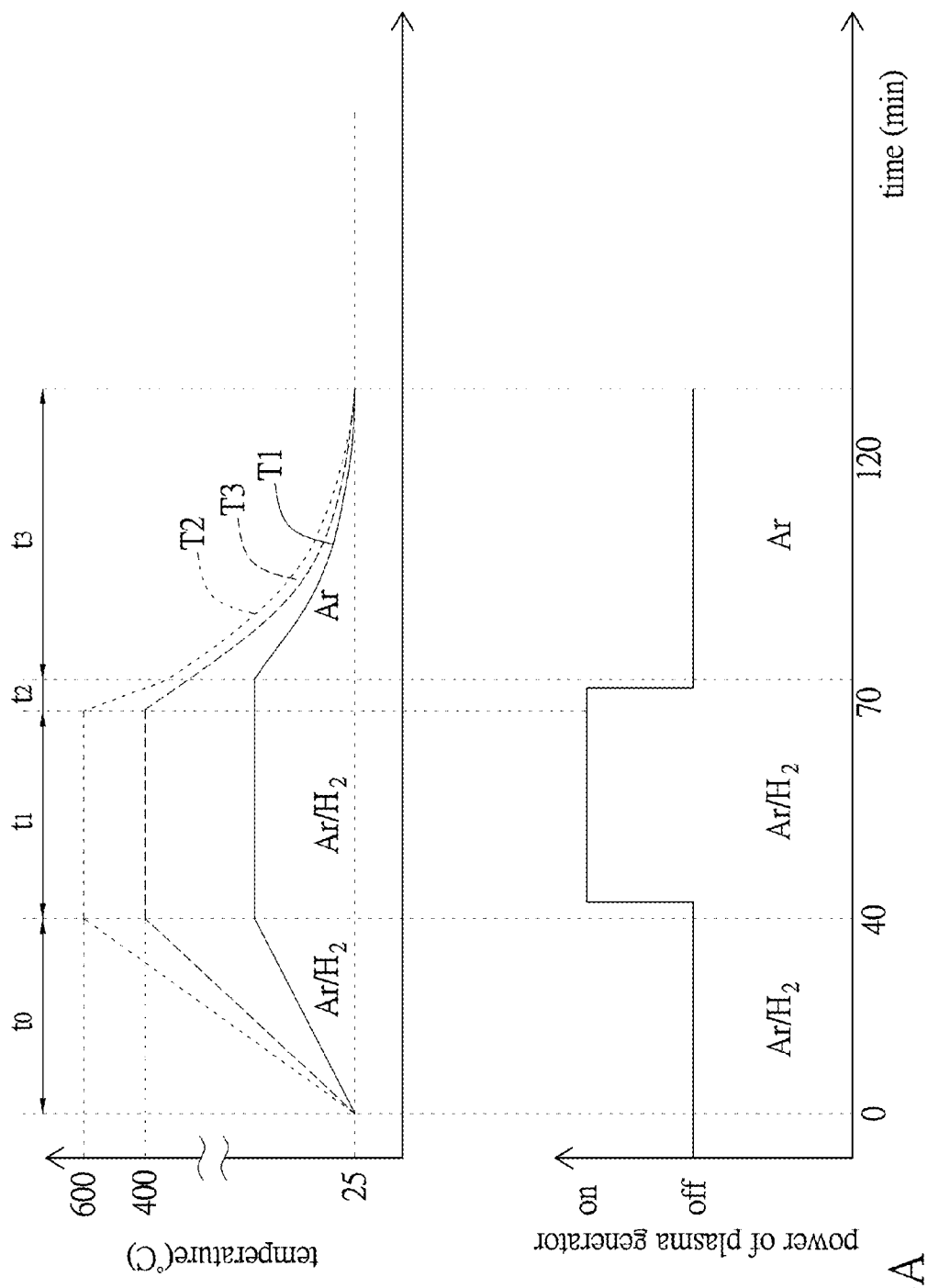
FIG. 8A shows a diagram illustrating temperature-time curves of the substrate, the metal-based precursor, and the chalcogen precursor, and also illustrating the output power of the plasma generator as a function of time during a method of fabricating the two-dimensional layered chalcogenide film in accordance with another embodiment of the instant disclosure.

FIG. 8A shows a diagram illustrating temperature-time curves of the substrate, the metal-based precursor, and the chalcogen-based precursor during a method of fabricating the two-dimensional layered chalcogenide film in accordance with another embodiment of the instant disclosure. The output power of the plasma generator as a function of time is also illustrated. In this case, the apparatus 1 shown in FIG. 1 is taken as an example to describe the method of fabricating two-dimensional layered molybdenum diselenide ($MoSe_2$) continuous films in details in the instant disclosure. The time-temperature curves T1, T2, and T3 illustrated in FIG. 8A is, respectively, for the chalcogen-based precursor, the metal-based precursor 4, and the substrate in the fabrication process.

At the stage t0, the substrate temperature T3 is raised to a reaction temperature ranging from 100° C. to 400° C. In the instant embodiment, the substrate temperature T3 can be raised to 400° C. The temperature T1 of the chalcogen-based precursor 3 is raised to a first initial temperature, which is set at about 250 to 270° C. The temperature T2 of the metal-based precursor 4 is raised to a second initial temperature, which is set at about 500 to 700° C. In the beginning of the stage t1, the plasma generator is turned on to facilitate the chalcogen substitution reaction of the metal-based precursor gas and deposit the two-dimensional layered chalcogenide film on the substrate 5. Subsequently, during the stage t3, the substrate temperature T3 and the temperature T2 of the metal-based precursor 4 are reduced, while the temperature T1 of the chalcogen-based precursor 3 is unchanged until the end of the stage t2, so that at least one continuous film can be formed on the substrate 5.

At the stage t3, the temperature T1 of the chalcogen-based precursor 3 is gradually reduced to room temperature, and the supply of the catalyst gas is also decreased. Furthermore, the plasma is turned off during the stage t2. In the instant embodiment, the power of the plasma is maintained at a preset value. At a start of reducing the temperature T1 of the chalcogen-based precursor 3, the plasma generator can be turned off.

Figure 8B:
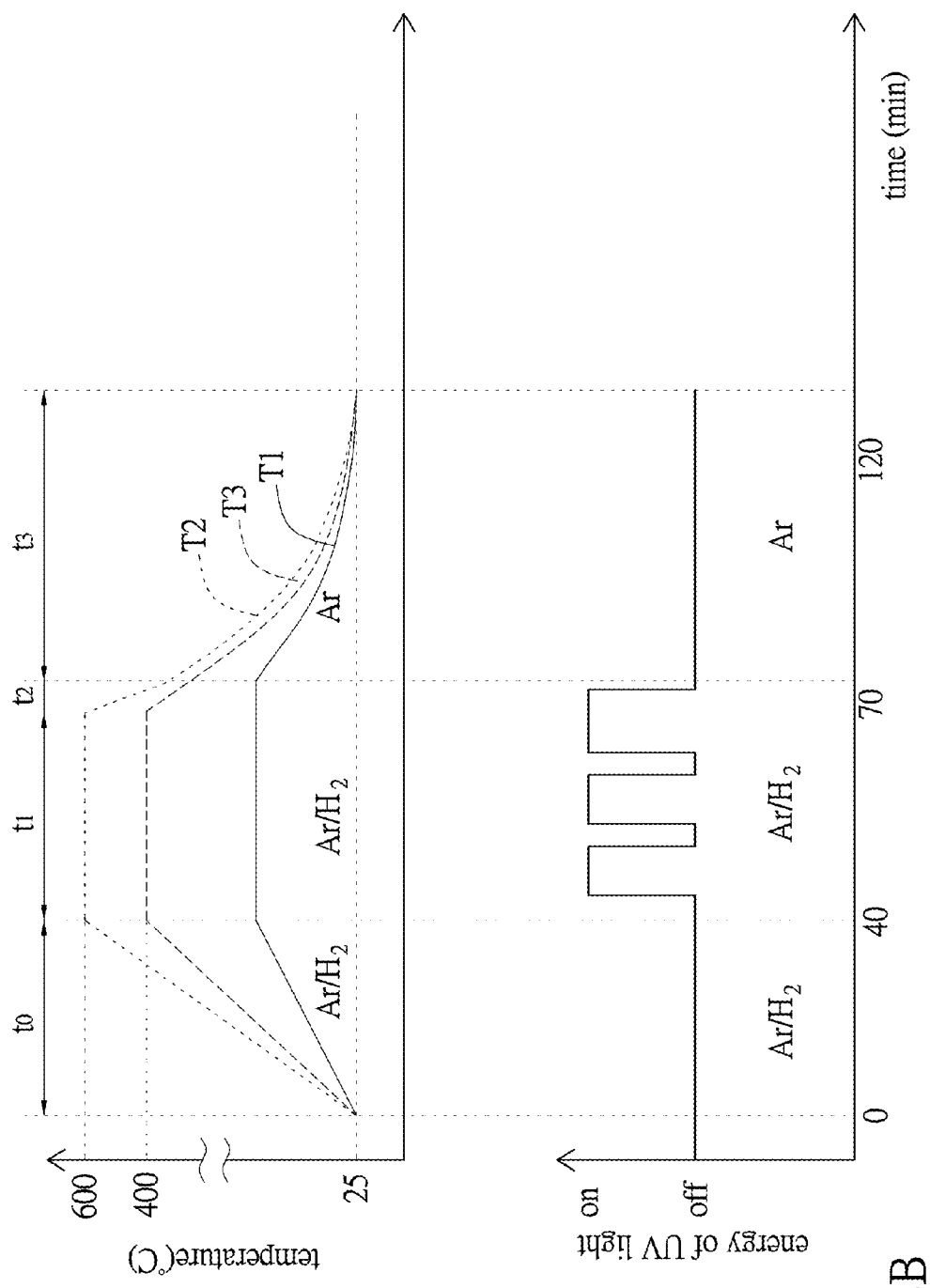
FIG. 8B shows a diagram illustrating temperature-time curves of the substrate, the metal-based precursor, and the chalcogen precursor, and also illustrating the on/off state of the UV light source at every time period during a method of fabricating the two-dimensional layered chalcogenide film in accordance with another embodiment of the instant disclosure.

FIG. 8B shows a diagram illustrating temperature-time curves of the substrate, the metal-based precursor, and the chalcogen-based precursor, and also illustrating the on/off state of the UV light at every growth stage during a method of fabricating the two-dimensional layered chalcogenide film in accordance with another embodiment of the instant disclosure. The UV light is only operated within the stage t1 and t2 to facilitate the chalcogen-substitution reaction. During the stage t0 and stage t4, the UV light is in off state. During the stage t1 and t2, i.e., during a predetermined reaction time, the UV light source is periodically turned on and off. As mentioned previously, it is likely that the deposited two-dimensional layered chalcogenide film might be damaged upon exposure of the UV light. Therefore, the periodic turning on and off the UV light can facilitate the chalcogen-substitution reaction, and, on the other hand, can minimize the potential damage of the two-dimensional layered chalcogenide film deposited on the substrate 5.

Notably, if the continuous chalcogenide film are deposited by CVD process without the external stimulus, the reaction temperature at the substrate needs to be raised to more than 800° C., leading to sublimation of chalcogen atoms from the deposited metal chalcogenide film. The metal chalcogenide film remained on the substrate 5 tends to form clusters, instead of a continuous film. Using the fabrication process provided in the instant disclosure, the reaction temperature at the substrate 5 can be lower than 800° C., forming continuous chalcogenide film on the substrate 5.

Additionally, during the stage t2, although the substrate temperature and the temperature of the metal-based precursor 4 are reduced, the temperature T1 of the chalcogen-based precursor is maintained at the first initial temperature (270° C.) so as to maintain the supply of the chalcogen-based precursor gas and decrease the chalcogen vacancies formed in the continuous film.

Figure 9A:
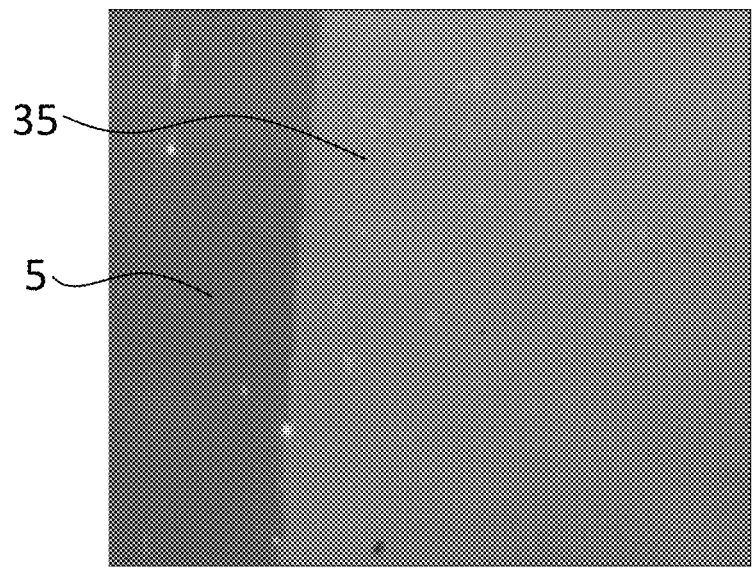
FIG. 9A is an optical microscopic image of the polycrystalline two-dimensional molybdenum diselenide ($MoSe_2$) monolayer film fabricated by a method in accordance with the instant disclosure.
Figure 9B:
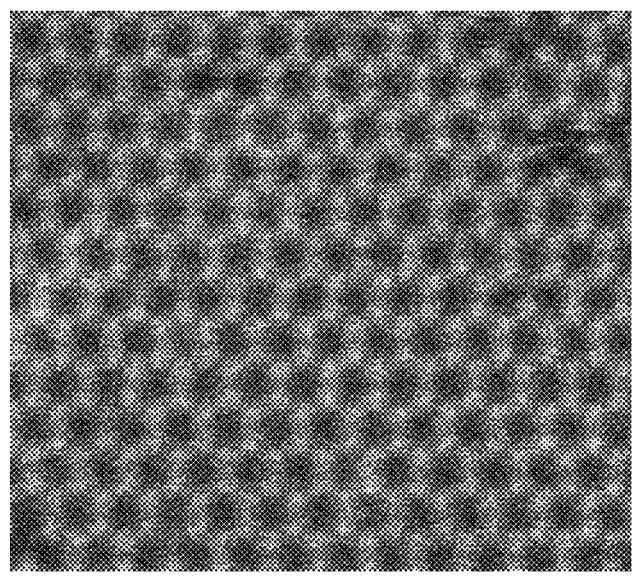
FIG. 9B is transmission electron microscopic image of the polycrystalline two-dimensional molybdenum diselenide ($MoSe_2$) monolayer fabricated by a method in accordance with the instant disclosure.
Figure 9C:
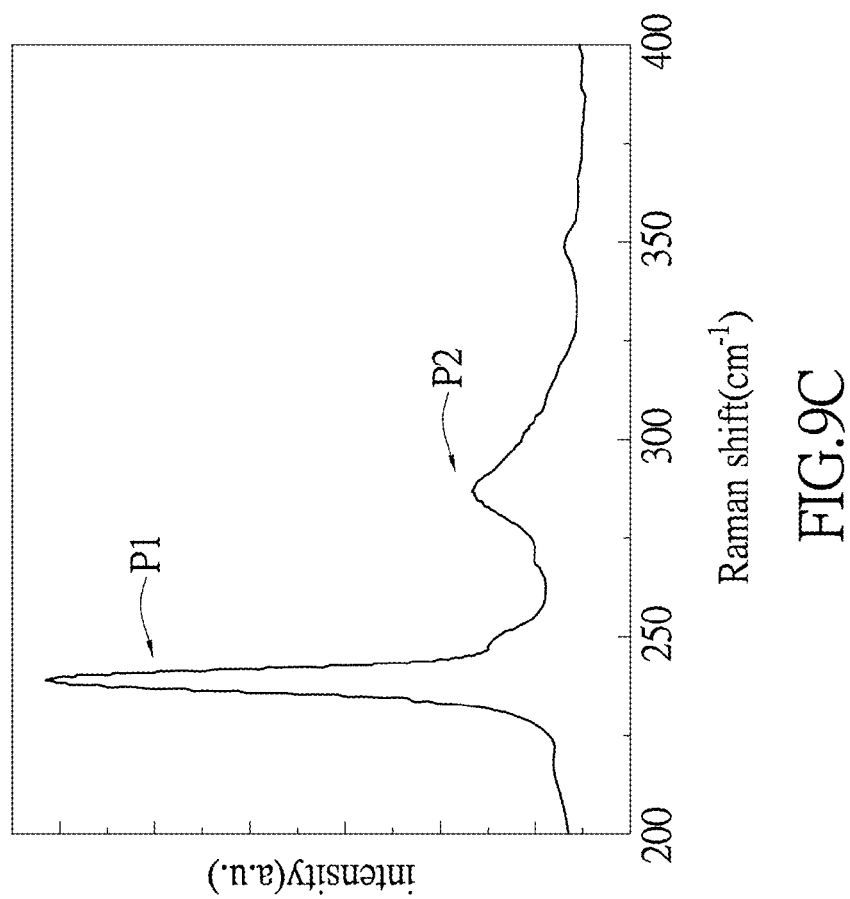
FIG. 9C is Raman spectra of the polycrystalline two-dimensional molybdenum diselenide ($MoSe_2$) monolayer film fabricated by a method in accordance with the instant disclosure.

FIG. 9A shows the optical microscopy image of the two-dimensional polycrystalline molybdenum diselenide (MoSe$_2$) monolayer fabricated by a method in accordance of the instant disclosure. As shown in FIG. 9A, the continuous film of the two-dimensional metal chalcogenide film 35 can be formed on the substrate 5 at a temperature down to 400° C. by using the external stimulus in the CVD process. FIG. 9B and FIG. 9C are, respectively, the transmission electron microscopy image and Raman spectrum of the two-dimensional polycrystalline molybdenum diselenide (MoSe$_2$) monolayer fabricated by a method in accordance of the instant disclosure.

Figure 9D:
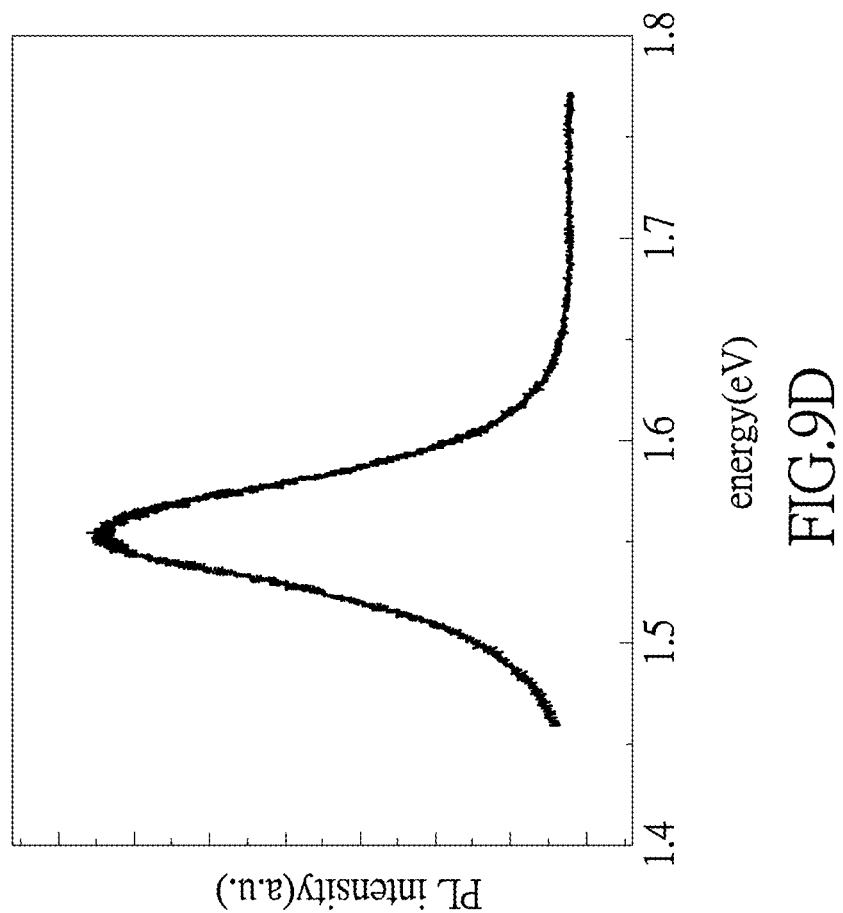
FIG. 9D is respective photoluminescence (PL) spectra of the polycrystalline two-dimensional monolayer molybdenum diselenide ($MoSe_2$) film fabricated by a method in accordance with the instant disclosure.

It is worth noting that most of the metal chalcogenide monolayer such as WSe$_2$ or MoSe$_2$ have direct band gap. However, the metal chalcogenide multilayer becomes indirect band gap, yielding a photoluminescence spectrum with very low intensity. FIG. 9D shows the photoluminescence spectrum of the two-dimensional polycrystalline molybdenum diselenide (MoSe$_2$) monolayer fabricated by a method in accordance of the instant disclosure, with a strong peak appearing at 1.55 eV. The strong photoluminescence peak indicates the nature of direct band gap and thus the monolayer characteristic of the film grown.

Additionally, the metal chalcogenide film with different number of layers can absorb lights with different wavelength due to the change of energy band gap. Therefore, in another embodiment of the method of fabricating the two-dimensional layered chalcogenide film in the instant disclosure, the stage t1 can be prolonged according to practical demands to obtain two-dimensional layered chalcogenide film with different number of layers.

The advantage of the method and the apparatus of fabricating two-dimensional layered chalcogenide film provided in an embodiment of the instant disclosure is that by using the external stimulus to ionize the reactant gases, the reaction temperature for the chalcogen-substitution reaction can be reduced and the two-dimensional layered chalcogenide film can be deposited on the substrate at a lower temperature. In one embodiment, the required reaction temperature for the chalcogen-substitution reaction such as sulfurization, selenization, or tellurization, can be reduced from a range of 800 to 1000° C. to a range of 100 to 700° C. Furthermore, when the substrate begins to be cooled down, the supply of the chalcogen-based precursor gas is still maintained at a preset value for the predetermined growth duration (such as the stage t2 shown in FIGS. 6A, 6B, 8A and 8B) to reduce the formation of chalcogen vacancies in the two-dimensional layered chalcogenide film.

The figures and descriptions supra set forth illustrate the preferred embodiments of the instant disclosure; however, the characteristics of the instant disclosure are by no means restricted thereto. It is anticipated that all changes, alterations, combinations or modifications conveniently considered by those skilled in the art are deemed to be encompassed within the scope of the instant disclosure delineated by the appended claims.

What is claimed is:

1. A method of fabricating two-dimensional layered chalcogenide film comprising:
   providing a substrate within a reaction chamber;
   heating the substrate to a reaction temperature;
   introducing a chalcogen-based precursor gas, a metal-based precursor gas, and a catalyst gas to the reaction chamber;
   providing an external stimulus to generate energetic particles from the chalcogen-based precursor gas, the metal-based precursor gas, and the catalyst gas, wherein the external stimulus is ultraviolet light, and the step of providing the external stimulus comprises intermittently turning on and off the ultraviolet light during a predetermined time; and
   forming a two-dimensional layered chalcogenide film on the substrate.

2. The method as recited in claim 1, wherein the metal-based precursor is selected from a group consisting of transition metals, Group IIIA components, Group IVA components, and the combination thereof.

3. The method as recited in claim 1, wherein the chalcogen-based precursor is selected from a group consisting of sulfur, selenium, tellurium, and the combination thereof.

4. The method as recited in claim 1, wherein the two-dimensional layered chalcogenide film is a continuous film and contains at least one layer.

5. The method as recited in claim 1, further comprising:
   decreasing a supply of the metal-based precursor gas when a substrate temperature begins to be reduced.

6. The method as recited in claim 5, further comprising:
   when the substrate temperature begins to be reduced, maintaining a supply of chalcogen-based precursor gas and a supply of catalyst gas for a predetermined duration.

7. The method as recited in claim 1, wherein the ultraviolet light has a wavelength between 160 nm and 400 nm.

8. The method as recited in claim 1, wherein the substrate is selected from the group consisting of sapphire, silicon-based materials, aluminum oxide, mica plate, dielectrics, and the combinations thereof.

9. The method as recited in claim 8, wherein the silicon-based materials is selected from a group consisting of silicon, silicon oxide, silicon nitride, and the combination thereof.

10. The method as recited in claim 1, wherein the reaction temperature ranges from 100° C. to 700° C.

11. A method of fabricating two-dimensional layered chalcogenide film comprising:
    providing a substrate within a reaction chamber;
    heating the substrate to a reaction temperature;
    introducing a chalcogen-based precursor gas, a metal-based precursor gas, and a catalyst gas to the reaction chamber;
    providing an external stimulus to generate energetic particles from the chalcogen-based precursor gas, the metal-based precursor gas, and the catalyst gas, wherein the external stimulus is plasma, and the step of providing the external stimulus comprises
    turning on the plasma; and
    turning off the plasma when a substrate temperature begins to be reduced; and
    forming a two-dimensional layered chalcogenide film on the substrate.

* * * * *